(12) United States Patent
Zia et al.

(10) Patent No.: US 7,067,342 B2
(45) Date of Patent: Jun. 27, 2006

(54) METHOD OF INTEGRATING OPTICAL DEVICES AND ELECTRONIC DEVICES ON AN INTEGRATED CIRCUIT

(75) Inventors: Omar Zia, Austin, TX (US); Nigel G. Cave, Austin, TX (US); Lawrence Cary Gunn, III, Encinitas, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/988,963

(22) Filed: Nov. 15, 2004

(65) Prior Publication Data

US 2006/0105488 A1    May 18, 2006

(51) Int. Cl.
*H01L 21/00* (2006.01)
*H01L 21/336* (2006.01)

(52) U.S. Cl. ............. 438/48; 438/65; 438/221; 438/296

(58) Field of Classification Search ............ 438/31, 438/32, 48, 65, 69, 221, 296, 424
See application file for complete search history.

(56) References Cited

U.S. PATENT DOCUMENTS

| 5,747,860 A * | 5/1998 | Sugiyama et al. ......... 257/432 |
| 6,608,945 B1 | 8/2003 | Deliwala |
| 6,654,511 B1 | 11/2003 | Deliwala |
| 6,687,446 B1 | 2/2004 | Arakawa |

| 2002/0164122 A1 | 11/2002 | Taylor, Jr. |
| 2003/0063885 A1 | 4/2003 | Gunn, III |
| 2003/0235370 A1 | 12/2003 | Taillaert |

FOREIGN PATENT DOCUMENTS

| WO | WO02/14915 A2 | 2/2002 |
| WO | WO03/023469 A1 | 3/2003 |
| WO | WO03/023476 A1 | 3/2003 |

OTHER PUBLICATIONS

Fischer et al., "0.1 dB/cm Waveguide Losses in Single-Mode SOI Rib Waveguides," IEEE Photonics Technology Letters, vol. 8, No. 5, May 1996, pp. 647-648.

* cited by examiner

*Primary Examiner*—Hsien-Ming Lee
(74) *Attorney, Agent, or Firm*—James L. Clingan, Jr.; Michael Balconi-Lamica

(57) ABSTRACT

A semiconductor structure has a waveguide a transistor on the same integrated circuit. One trench isolation technique is used for defining a transistor region and another is used for optimizing a lateral boundary of the waveguide. Both the waveguide and the transistor have trenches with liners that can be separately optimized. The transistor has a salicide for source/drain contacts. During this process, a salicide block is used over the waveguide to prevent salicide formation in unwanted areas of the waveguide. The depth of the trench for the waveguide can be lower than that of the trench for the transistor isolation. Trench isolation depth can be set by an etch stop region that can be either a thin oxide layer or a buffer layer that is selectively etchable with respect to the top semiconductor layer and that can be used as a seed layer for growing the top semiconductor layer.

67 Claims, 8 Drawing Sheets

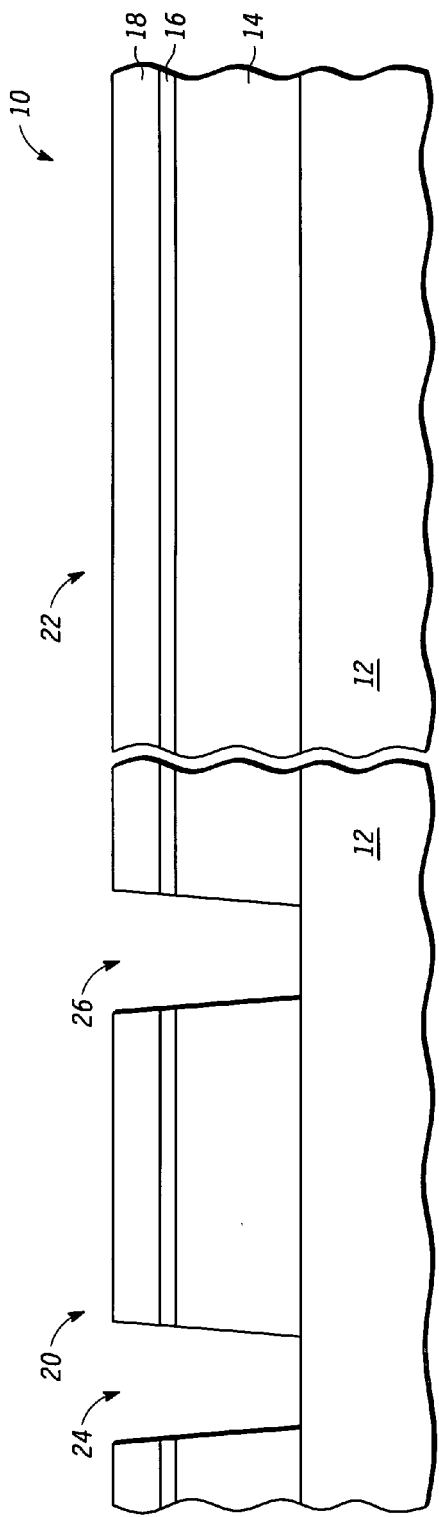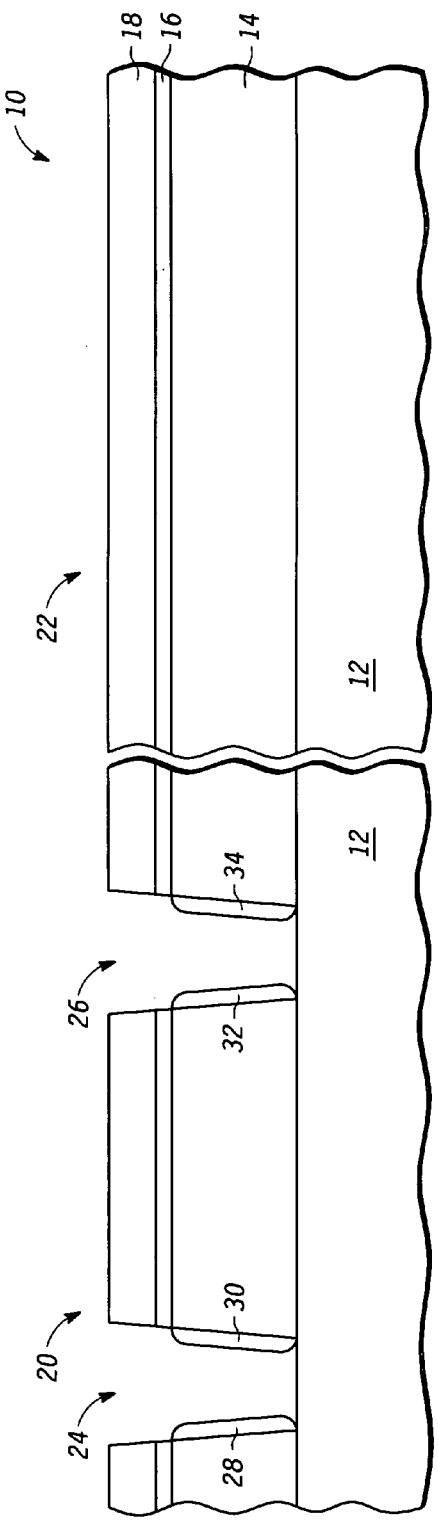

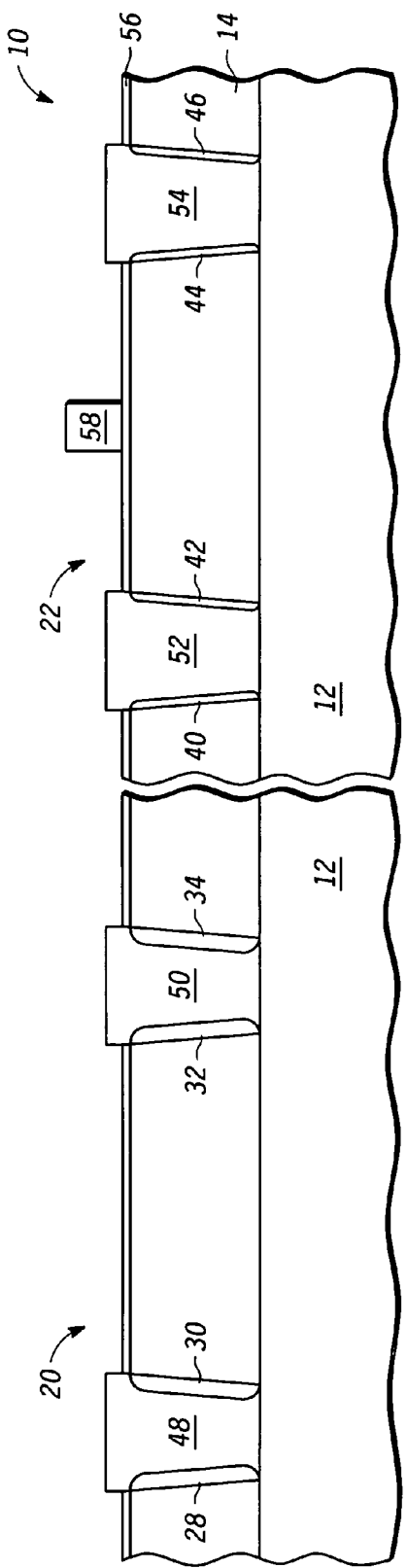
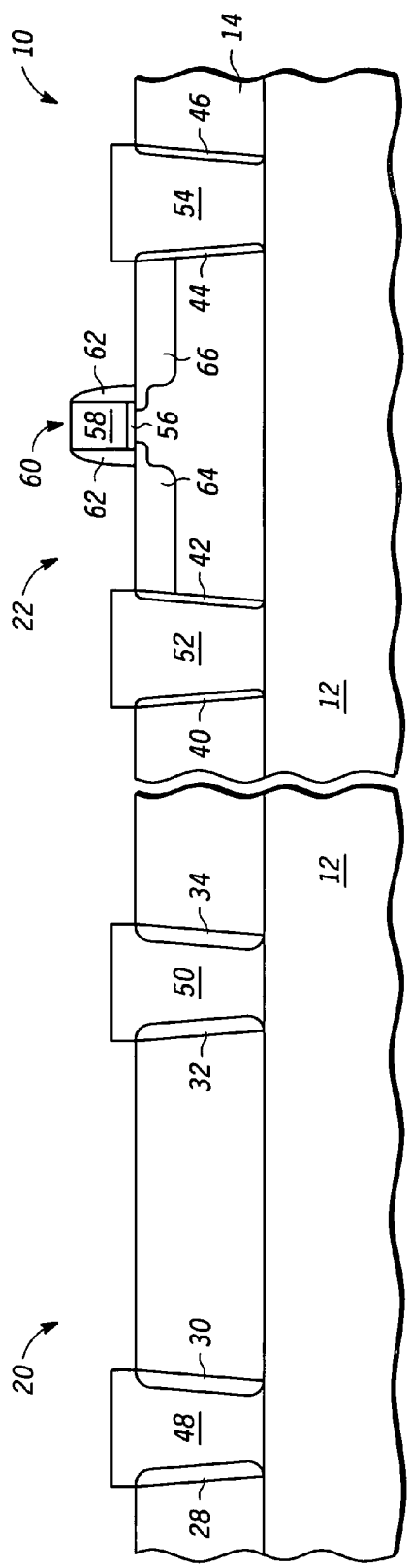

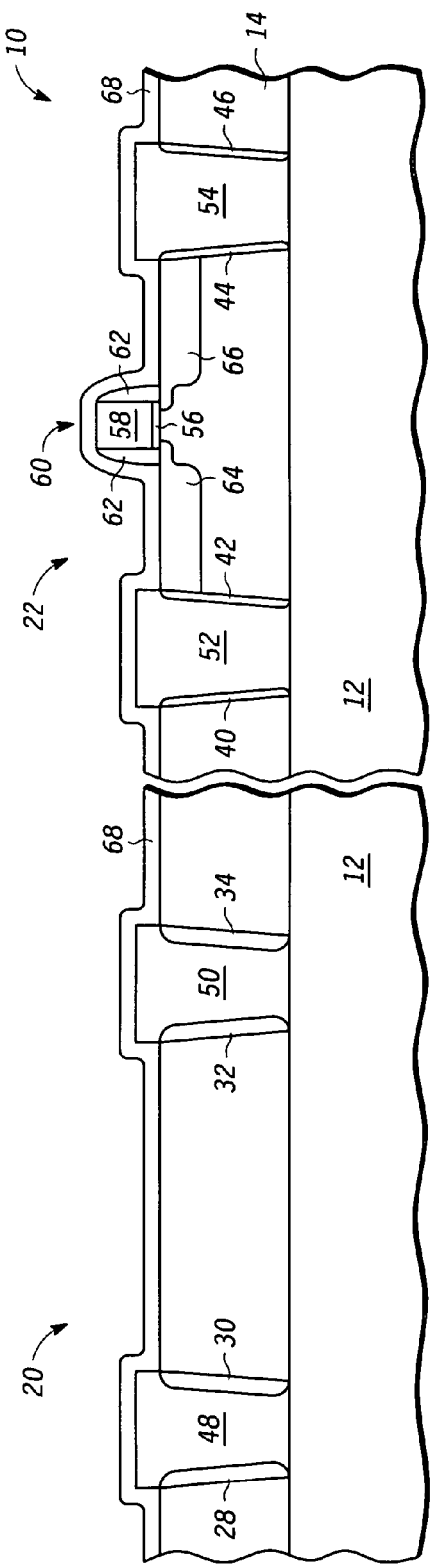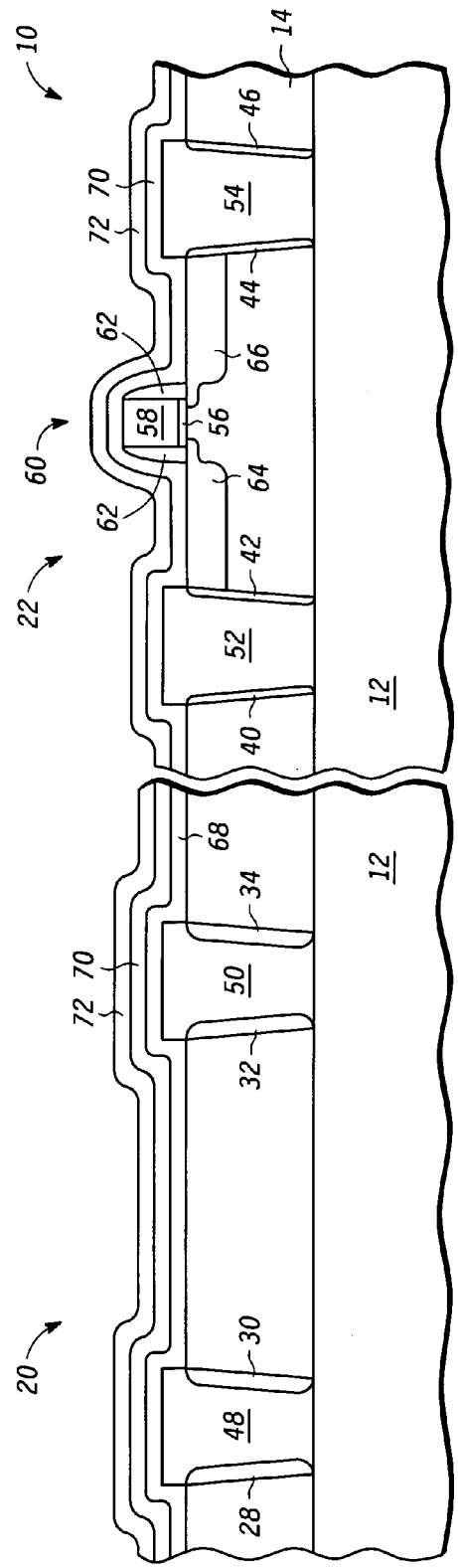

US 7,067,342 B2

METHOD OF INTEGRATING OPTICAL DEVICES AND ELECTRONIC DEVICES ON AN INTEGRATED CIRCUIT

FIELD OF THE INVENTION

The present invention relates to providing different devices types on the same integrated circuits, and more particularly to integrating optical devices with electronic devices on the same integrated circuit.

RELATED ART

As semiconductor processes and lithography continue to improve, transistor switching speeds continue to improve, which results in higher performance circuit functions. The circuits provide their outputs to other circuits. Often buses that are relatively long carry these signals. These buses inherently have capacitance and resistance so that an RC delay is present for an electrical signal being carried by the bus. The buses can be made bigger to reduce the resistance but that can also increase capacitance. Also there can be a great number of buses so that increasing bus size can cause the size of the integrated circuit to increase as well. The net effect is that the carrier of the signal is often a major speed limitation. Additional increases in transistor switching speed can result in relatively small increases in overall speed of operation.

One difficulty has been finding a practical way to take advantage of optical interconnects for signal transmission on an integrated circuit. One major issue is routing the optical signal in a manner that is manufacturable and consistent with transistor manufacturing considerations. The considerations are different for the two and either one or the other can become marginally functional or prohibitively expensive.

Thus, there is a need for a method for providing an improvement in integrating optical devices with electronic devices on the same integrated circuit.

BRIEF DESCRIPTION OF THE DRAWINGS

The present invention is illustrated by way of example and not limited by the accompanying figures, in which like references indicate similar elements, and in which:

FIG. 1 is a cross section of a semiconductor device structure useful in understanding a method according to a first embodiment of the invention at a stage in processing;

FIG. 2 is a cross section of the semiconductor device structure of FIG. 1 at a subsequent stage in processing;

FIG. 5 is a cross section of the semiconductor device structure of FIG. 4 at a subsequent stage in processing;

FIG. 6 is a cross section of a semiconductor device structure of FIG. 5 at a subsequent stage in processing;

FIG. 7 is a cross section of the semiconductor device structure of FIG. 6 at a subsequent stage in processing;

FIG. 8 is a cross section of the semiconductor device structure of FIG. 7 at a subsequent stage in processing;

Figure 3:
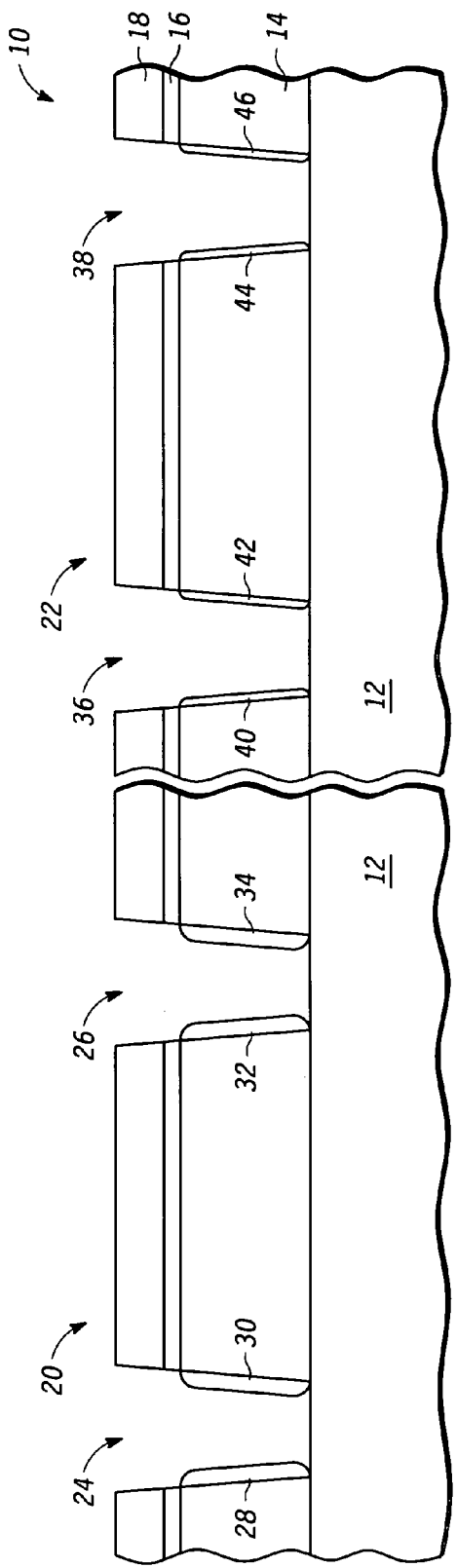
FIG. 3 is a cross section of the semiconductor device structure of FIG. 2 at a subsequent stage in processing.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a semiconductor device structure has both a waveguide and a transistor on the same integrated circuit. Trench isolation is used for defining the transistor region. A separate trench isolation process is used for providing lateral confinement for the waveguide, which is in the direction of the plane of the wafer's surface, to optimize this trench isolation for the waveguide. As an alternative, both trenches may be formed simultaneously with a single trench patterning and etch step. In eithercase, both the waveguide and the transistor have trenches with liners although these liners can be separately optimized. There is more flexibility for such optimization in the case where trenches are separately formed for the optical and transistor regions. The transistor has a salicide for source/drain contacts. During this process a salicide block is used over the waveguide to prevent salicide formation in unwanted areas of the waveguide. Also, the depth of the trench for the waveguide can be smaller than that of the trench for the transistor isolation as determined precisely by the particular desired optical characteristics of the waveguide. The depth of the waveguide trench is set by an etch stop region or by a timed etch. In the case of using an etch stop region, it can be set by a thin oxide layer or by a buffer layer that is selectively etchable to that of the top semiconductor layer but is also useful as a seed layer for epitaxially growing the top semiconductor layer. This is better understood with reference to the drawings and the following description.

Shown in FIG. 1 is a semiconductor device structure 10 comprising an insulating layer 12, a semiconductor layer 14 on insulating layer 12, a pad oxide layer 16 on semiconductor layer 14, and a nitride layer 18. Semiconductor device structure 10 is divided into an optical region 20 and an electronic region 22. In this example, optical region 20 is for forming a waveguide and electronic region 22 is for forming a transistor. Optical region 20 has an opening 24 and an opening 26. Openings 24 and 26 extend to insulating layer 12. Semiconductor layer 14 is preferably monocrystalline silicon that is about 3000 Angstroms thick, which is particularly suitable as a waveguide core for a wavelength of 1.55 microns, a common telecommunications wavelength. Insulating layer 12 is preferably oxide about 8000 Angstroms thick or graded in thickness on a relatively thick silicon substrate that is not shown in FIG. 1. Insulating layer 12 and semiconductor layer 14 together in this described manner are similar to a standard semiconductor on insulator (SOI) wafer except that in this case silicon layer 14 is thicker than the corresponding active silicon layer in a conventional SOI wafer. During the formation of openings 24 and 26, transistor region 22 is masked so that no openings are formed in transistor region 22. Openings such as openings 24 and 26 are often called trenches. Pad oxide 16 and nitride 18 are conventional layers used in preparation for trench formation.

Shown in FIG. 2 is semiconductor device structure 10 after formation of liners 28 and 30 in opening 24 and liners 32 and 34 in opening 26. Liners 28, 30, 32, and 34 are oxide grown on the exposed surface of semiconductor layer 14 inside openings 24 and 26. In addition to or instead of forming liners 28, 30, 32, and 34, other desired treatments to openings 24 an 26 may be performed. A treatment that results in increasing the smoothness, oxidation does do this, would be desirable to reduce loss of the optical signal being carried in the waveguide.

Shown in FIG. 3 is semiconductor device structure 10 after etching openings 36 and 38 in electronic region 22 and forming liners 40 and 42 in opening 36 and liners 44 and 46 in opening 38. Liners 40, 42, 44, and 48 are formed by growing oxide on the exposed surfaces of layer 14 in openings 36 and 38. During this oxide growth, liners 28, 30, 32, and 34 continue to grow as well further reducing edge roughness in openings 24 and 26. Thus, liners 28, 30, 32, and 34 can be optimized for waveguide performance while liners 40, 42, 44, and 48 can be optimized for transistor performance or reliability. In the alternative and for simplicity, openings 20, 22, 24 and 26 could be formed at the same time and the subsequent formation of liners 28, 30, 32, 34, 40, 42, 44, and 46 could also be performed at the same time.

Figure 4:
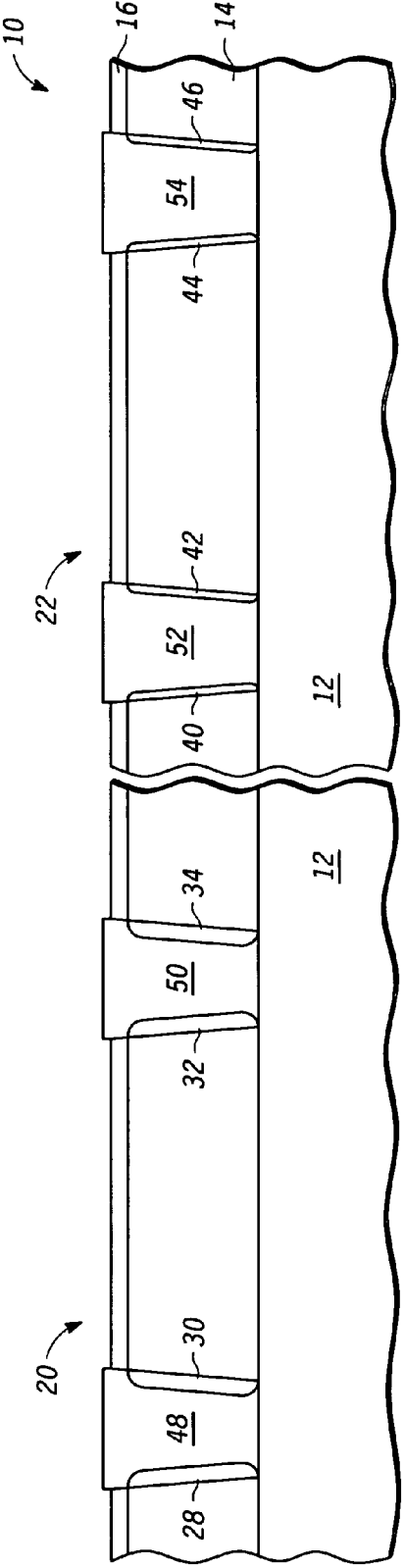
FIG. 4 is a cross section of the semiconductor device structure of FIG. 3 at a subsequent stage in processing.

Shown in FIG. 4 is semiconductor device structure 10 after a conventional trench fill and nitride strip operation to form isolation region 48 in opening 24, isolation region 50 in opening 26, isolation region 52 in opening 36, and isolation region 54 in opening 38 and remove nitride layer 18. Isolation regions 48, 50, 52, and 54 are preferably high density plasma (HDP) oxide.

Shown in FIG. 5 is semiconductor device structure 10 after forming removing pad oxide 16, forming a gate dielectric on the exposed surfaces of layer 14, and forming a gate on gate dielectric 56 between isolation regions 52 and 54. Other conventional implants, such as well and threshold adjust implants, are not shown for ease in understanding of the invention.

Shown in FIG. 6 is semiconductor device structure 10 after forming a transistor 60 in electronic region 22 using conventional means. Transistor 60 comprises a gate dielectric 56 over semiconductor layer 14, gate 58 over gate dielectric 56, a sidewall spacer 62 around gate 58, a source/drain 64 in semiconductor layer 14 on one side of gate 58, and a source/drain 66 in semiconductor layer 14 on the other side of gate 58.

Shown in FIG. 7 is semiconductor device structure 10 after formation of hard mask 68 that is preferably a tetraethylorthosilicate oxide (TEOS). Hard mask 48 is about 200 Angstroms thick and is relatively conformal.

Shown in FIG. 8 is semiconductor device structure 10 after selective removal of hard mask 68 over electronic region 22 and the deposition metal layer 70 and metal layer 72. Metal layer 70 is on hard mask 68 in optical region 20 and on the exposed surfaces of semiconductor layer 14, over isolation regions 52, 54, on sidewall spacer 62, and on gate 58. Metal layer 70 is preferably cobalt or nickel. Metal layer 72, which is on metal layer 70, is preferably titanium nitride (TiN) or just titanium (Ti).

Figure 9:
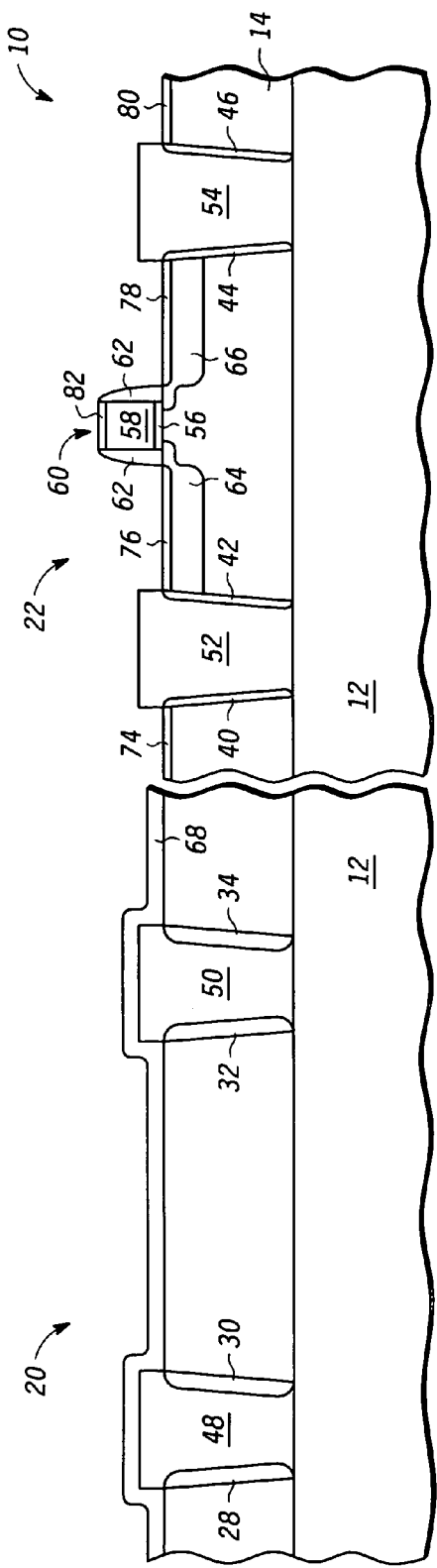
FIG. 9 is a cross section of the semiconductor device structure of FIG. 8 at a subsequent stage in processing.

Shown in FIG. 9 is semiconductor device structure 10 after forming salicide regions 74, 76, 78, 80, and 82 where there was exposed silicon and removal of the unreacted portions of metal layers 70 and 72. Salicide is formed due to an annealing step which causes the cobalt of metal layer 70 to react with silicon. The primary purpose is to have low resistance contacts with source/drain regions 64 and 66. The portion of metal layer 70 that is not reacted is selectively etchable in relation to the cobalt that has reacted with silicon. Hard mask 68 over optical region 20 prevents metal layer 70 from contacting silicon in optical region 20 so that layer 70 does not react in optical region 20. This allows for the easy removal of layers 70 and 72 over optical region 20.

Figure 10:
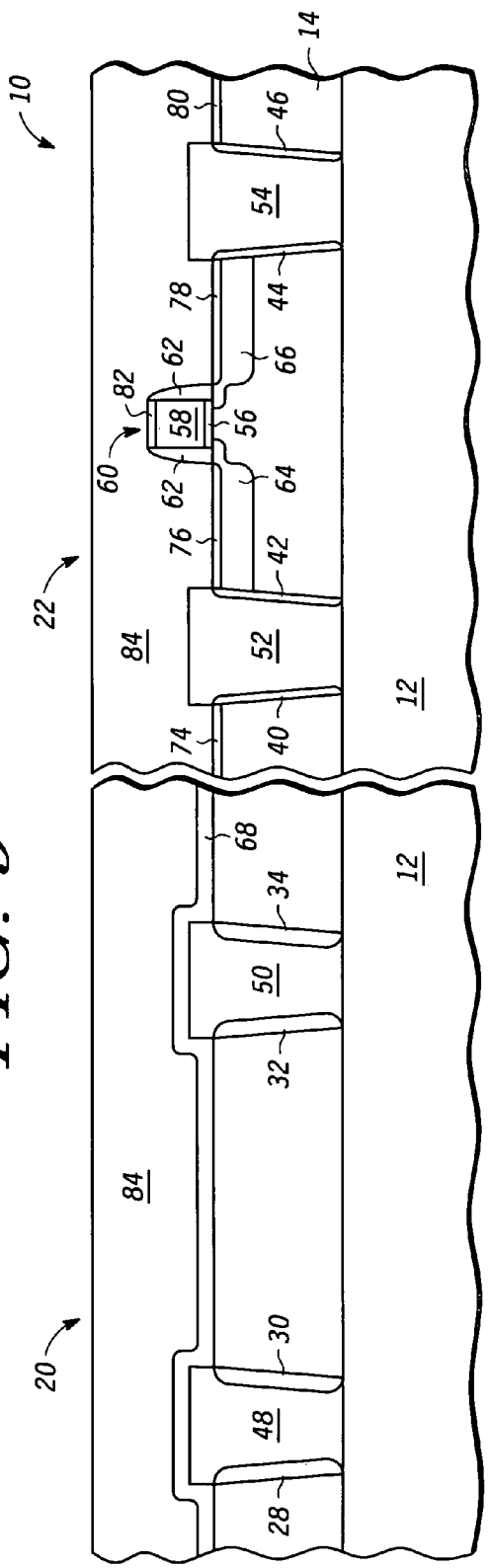
FIG. 10 is a cross section of the semiconductor device structure of FIG. 9 at a subsequent stage in processing.

Shown in FIG. 10 is semiconductor device structure 10 after deposition of an insulating layer 84. This is useful as an interlevel dielectric (ILD) and also an upper cladding layer completing formation of the waveguide. Semiconductor layer 14 between isolation regions 48 and 50 forms the core of the waveguide. Isolation regions 48 and 50 are the waveguide side cladding, insulating layer 12 is the bottom waveguide cladding, and hard mask layer 68 and insulating layer 84 form the waveguide upper cladding.

Figure 11:
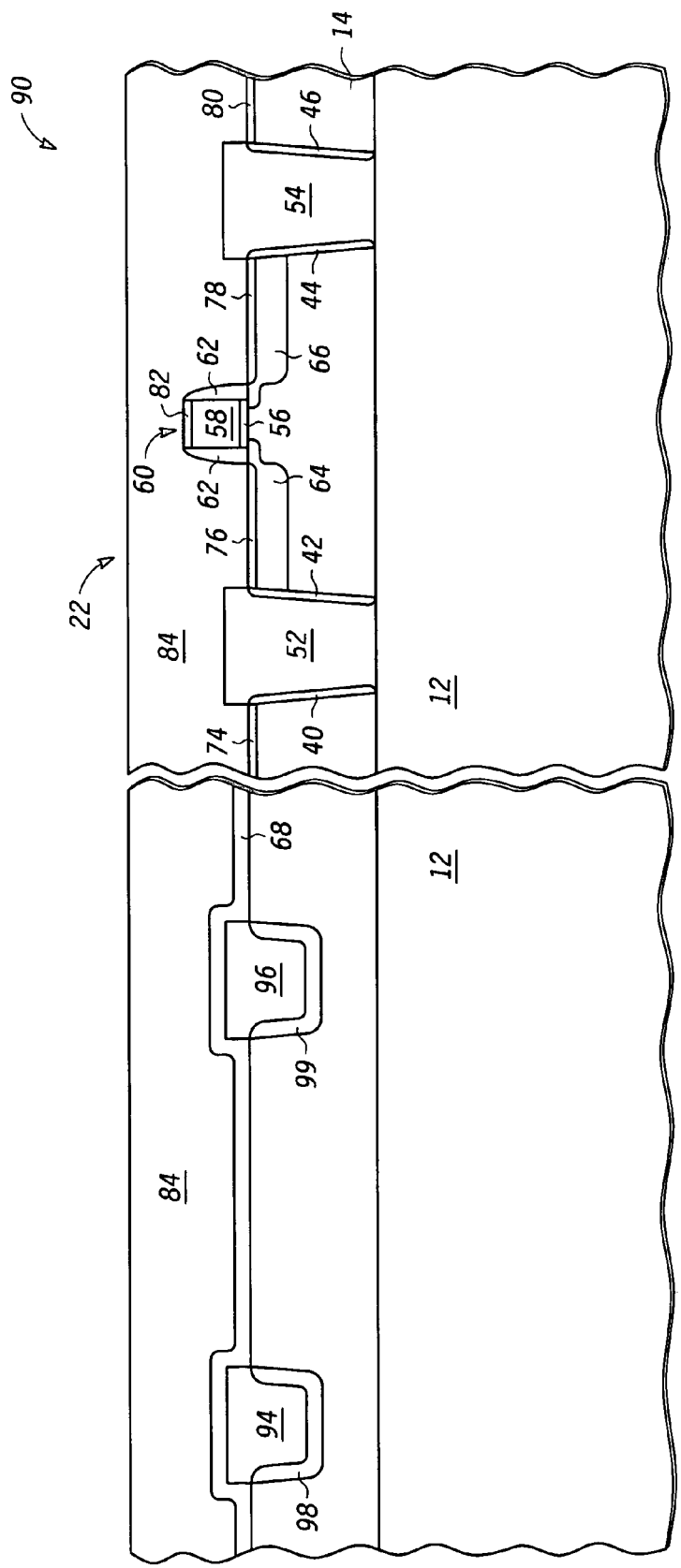
FIG. 11 is a cross section of a semiconductor device useful in understanding a method according to a second embodiment of the invention at a stage in processing.

Shown in FIG. 11 is a semiconductor device structure 90 similar to that of FIG. 10 which is formed by a somewhat different method. The features that are the same retain the same numbers. The difference in method is that the etch that forms openings 24 and 26 shown in FIG. 1 does not cause the opening to extend all the way to insulating layer 12. This is a timed etch to achieve the desired depth of the opening. The result shown in FIG. 11 is isolation region 94 that replaces isolation region 48 and isolation region 96 that replaces isolation region 50. Because the opening for isolation regions 94 and 96 did not extend to insulating layer 12, liners 98 and 99, for isolation regions 94 and 96, respectively, are continuous. The primary reason to not have isolation regions extend to insulating layer 12 is to increase waveguide performance in relation to the desired optical properties of the waveguide.

Figure 12:
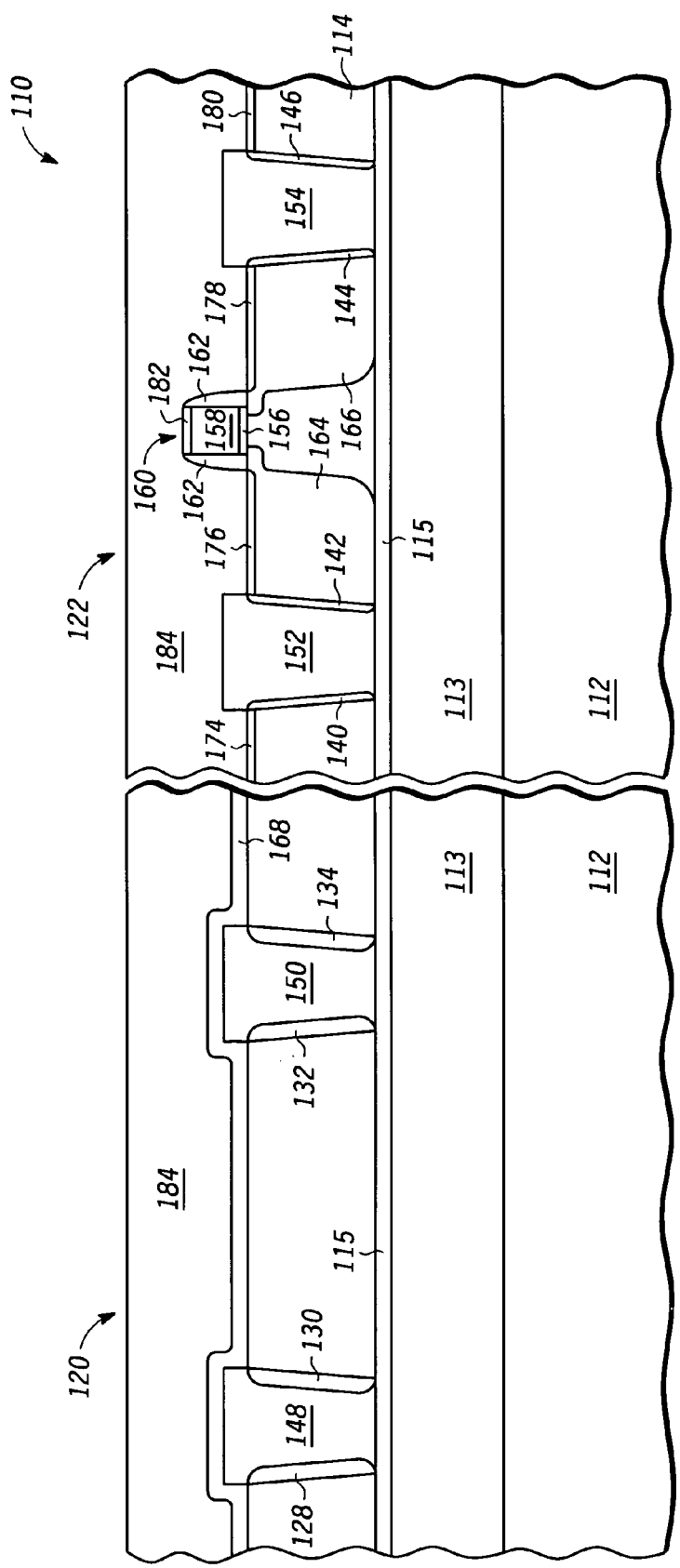
FIG. 12 is a cross section of a semiconductor device useful in understanding a method according to a third embodiment of the invention at a stage in processing.

Shown in FIG. 12 is a semiconductor device structure 110 similar to that of FIG. 10 in which the analogous features in FIG. 12 have a "1" in front of the corresponding numeral of FIG. 10. The steps are substantially the same. The primary difference is in the starting material. The top semiconductor layer 114 is analogous to semiconductor layer 14 with the difference being that semiconductor layer 114 is about 700 Angstroms, which can be chosen to optimize transistor performance. Under semiconductor layer 114 is an insulating layer 115 for which there is no analog in FIGS. 1–10. Insulating layer 115 acts as an etch stop in the formation of the openings for isolation regions 148 and 150 as well as isolation regions 152 and 154. Under layer 115 is a semiconductor layer 113 that is preferably undoped monocrystalline silicon. Under semiconductor layer 113 is insulating layer 112 which is analogous to insulating layer 12 of FIGS. 1–10. The starting material can be made in the same fashion as SOI wafers are made by simply adding another layer of insulation and another layer of semiconductor. This would add cost to the wafer due to the increase complexity. The analogous source/drain regions 164 and 166 thus preferably extend all the way to insulating layer 115. The waveguide then is in semiconductor layer 114 between isolation regions 148 and 150 and also in semiconductor layer 113 that is under the waveguide portion of semiconductor layer 114. This method thus allows for both enhancing waveguide performance by the reduced isolation depth and for high transistor performance by the reduced thickness of the active semiconductor layer.

Figure 13:
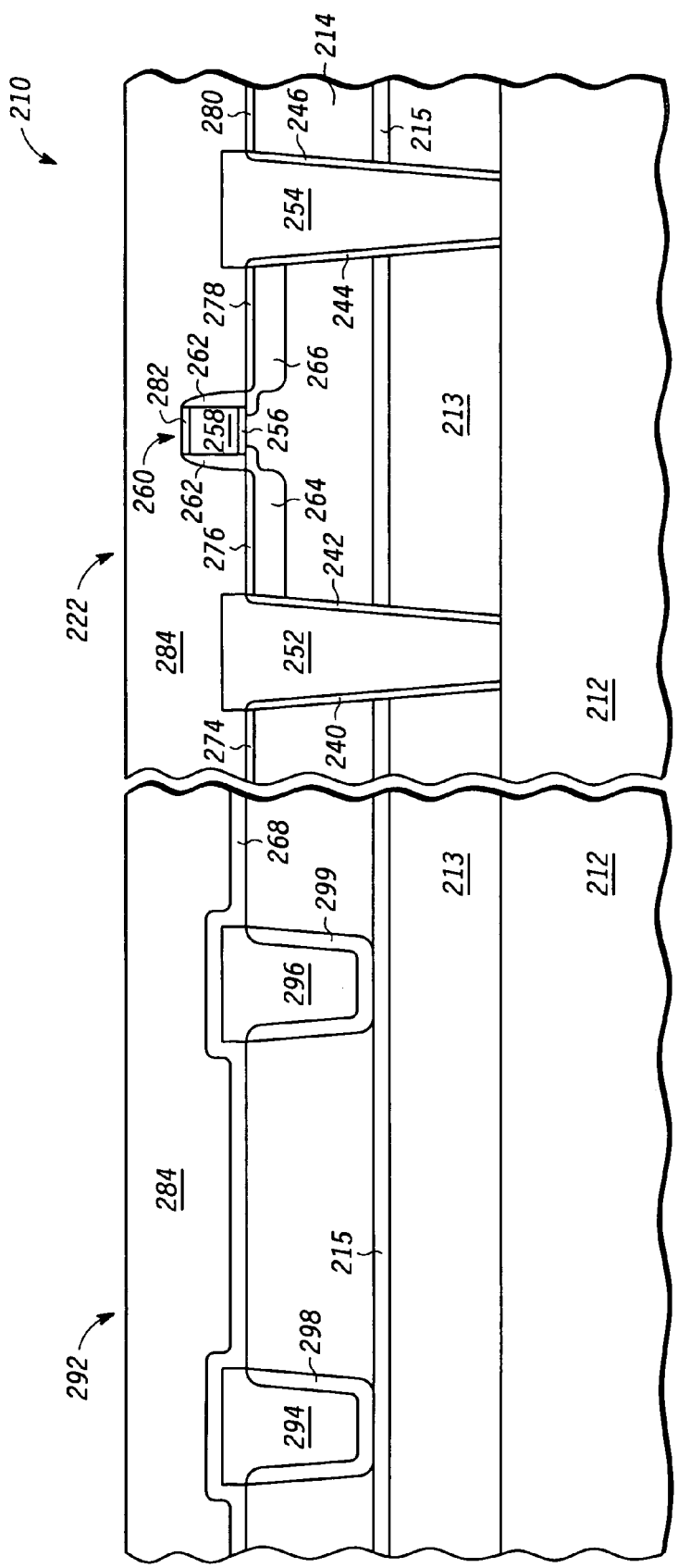
FIG. 13 is a cross section of a semiconductor device useful in understanding a method according to a fourth embodiment of the invention at a stage in processing.

Shown in FIG. 13 is a semiconductor device structure 10 similar to FIG. 11 and made in a similar fashion to that of FIG. 11. The analogous features have a "2" in front of the corresponding numeral in FIG. 11. The starting material is similar to a standard SOI wafer except that the top semiconductor layer, a semiconductor layer 212 is preferably about 1500 Angstroms. A layer, such as silicon germanium carbide, is chosen sot can be epitaxially grown to form a semiconductor layer 215, which has the same lattice constant as semiconductor layer 212. Semiconductor layer 215 then functions as a seed layer to grow a silicon layer 214 to about 1500 Angstroms. Thus, the openings for isolation regions 294 and 296 can be etched through semiconductor layer 214 and stopped on semiconductor layer 215. This does not have to be a simple timed etch because semiconductor layer 215 has a different etch selectivity. Silicon germanium carbide can be etched selective to silicon. The openings for isolation regions 252 and 254 in electronic region 222 preferably extend to insulating layer 212 because layers 213, 214, and 215 are all semiconductor regions. The waveguide is in semiconductor layer 214 between isolation regions 294 and 296 and in semiconductor layers 213 and 215 below the waveguide portion of semiconductor layer 214. Thus, the waveguide in FIG. 13 is enhanced by having the reduced depth of isolation regions 294 and 296 and consistently so due to the etch characteristic of semiconductor layer 215.

In the foregoing specification, the invention has been described with reference to specific embodiments. However, one of ordinary skill in the art appreciates that various modifications and changes can be made without departing from the scope of the present invention as set forth in the claims below. For example, another material may used instead of silicon germanium carbide that provides etching selectivity and also can function as a seed layer for monocrystalline epitaxial growth. Similarly, the MOSFETs in a transistor portion of the integrated circuit could have any of a multitude of architectures. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for integrating an optical device and an electronic device on a semiconductor substrate, comprising:
   providing a semiconductor substrate having an active semiconductor layer;
   forming openings within the active semiconductor layer in a first region of the semiconductor substrate and openings within the active semiconductor layer in a second region of the semiconductor substrate, wherein the first region corresponds to an optical device portion of the semiconductor substrate and the second region corresponds to an electronic device portion of the semiconductor substrate;
   forming optical liners on sidewalls within the openings of the active semiconductor layer in the optical device portion of the semiconductor substrate;
   forming trench liners on sidewalls within the openings of the active semiconductor layer in the electronic device portion of the semiconductor substrate, wherein forming the optical liners in the openings of the active semiconductor layer in the optical device portion of the semiconductor substrate and forming the trench liners in the openings of the active semiconductor layer in the electronic device portion of the semiconductor substrate comprises one of: (i) simultaneously forming the optical liners and the trench liners, or (ii) independently forming the optical liners in the optical device portion from the trench liners in the electronic device portion;
   filling the openings of the active semiconductor layer in the optical device portion of the semiconductor substrate and the openings of the active semiconductor layer in the electronic device portion of the semiconductor substrate with a fill material;
   forming at least a portion of an electronic device on the active semiconductor layer within the electronic device portion of the semiconductor substrate;
   forming a salicide blocking layer overlying the optical device portion of the semiconductor substrate;
   saliciding the electronic device portion of the semiconductor substrate, wherein the salicide blocking layer prevents salicidation of the active semiconductor layer within the optical device portion of the semiconductor substrate; and
   forming an interlevel dielectric layer overlying the optical device portion and the electronic device portion of the semiconductor substrate, wherein the interlevel dielectric can act as an upper cladding layer of an optical device formed within the optical device portion of the semiconductor substrate.

2. The method of claim 1, wherein forming the optical liners smoothes a roughness of the sidewalls within the openings of the active semiconductor layer in the optical device portion of the semiconductor substrate.

3. The method of claim 1, wherein forming the optical liners comprises an oxidation process optimized to provide a lowest loss waveguide as a function of a reduction in sidewall roughness.

4. The method of claim 1, wherein the optical liners comprises a thickness greater than a thickness of the trench liner.

5. The method of claim 1, wherein forming the openings of the active semiconductor layer in the electronic device portion of the semiconductor substrate comprises etching the openings, and wherein forming the trench liners comprises an oxidation process optimized to passivate the etched sidewalls, round corners of the openings, and to optimize a stress in the active semiconductor layer between the openings of the active semiconductor layer in the electronics device portion of the semiconductor substrate.

6. The method of claim 1, wherein forming the trench liners comprises an oxidation process optimized to control stresses in the active semiconductor layer between the openings.

7. The method of claim 1, wherein the trench liners have a thickness configured to provide an optimized high performance electronic device characteristic.

8. The method of claim 1, wherein forming the salicide blocking layer comprises depositing TEOS on the optical device portion and the electronic device portion of the semiconductor substrate and then removing the TEOS from the electronic device portion.

9. The method of claim 1, wherein forming the salicide blocking layer comprises patterning the blocking layer to overlie the optical device portion of the semiconductor substrate alone.

10. The method of claim 1, wherein saliciding includes forming a salicidation metallization overlying the optical device portion and the electronic device portion of the semiconductor substrate, annealing the salicidation metallization to form salicided regions on exposed regions of semiconductor material within the electronic device portion of the semiconductor substrate, wherein the salicide blocking layer prevents salicidation of the salicidation metallization overlying the active semiconductor layer within the optical device portion of the semiconductor substrate.

11. The method of claim 10, further wherein saliciding includes removing unreacted silicidation metallization.

12. The method of claim 1, wherein forming openings within the active semiconductor layer in the first region and within the active semiconductor layer in the second region comprises one of: (i) simultaneously forming openings in the optical device portion and the electronic device portion, or (ii) independently forming openings in the optical device portion from openings in the electronic device portion, or (iii) using a dual trench process that includes forming the openings in the optical device portion to a first depth, and forming the openings in the electronic device portion to a second depth, the second depth being greater than the first depth.

13. The method of claim 12, wherein the active semiconductor layer comprises one of: (i) a top semiconductor layer of a semiconductor-on-insulator substrate, or (ii) a top semiconductor layer of a dual semiconductor-on-insulator substrate, or (iii) a top semiconductor layer overlying a second semiconductor layer, the second semiconductor layer having an etch selectivity different from an etch selectivity of the top semiconductor layer, and the second semiconductor layer overlying a bottom semiconductor layer, the bottom semiconductor layer overlying a buried oxide.

14. The method of claim 13, wherein the fill material includes one or more of TEOS, a furnace oxide, or a high density plasma oxide.

15. The method of claim 13, wherein the fill material comprises a material selected to provide a desired optical index of refraction.

16. The method of claim 15, further wherein the optical index of refraction of the fill material is less than an optical index of refraction of silicon.

17. The method of claim 13, wherein the portion of the electronic device comprises at least a gate dielectric and a gate electrode on the active semiconductor layer.

18. The method of claim 17, wherein the portion of the electronic device further comprises sidewall spacers adjacent sidewalls of the gate electrode.

19. The method of claim 18, wherein the portion of the electronic device further comprises source/drain regions proximate the gate electrode, gate dielectric, and sidewall spacers within the electronic device portion of the semiconductor substrate.

20. The method of claim 1, wherein the active semiconductor layer comprises one of: (i) a top semiconductor layer of a semiconductor-on-insulator substrate, or (ii) a top semiconductor layer of a dual semiconductor-on-insulator substrate, or (iii) a top semiconductor layer overlying a second semiconductor layer, the second semiconductor layer having an etch selectivity different from an etch selectivity of the top semiconductor layer, and the second semiconductor layer overlying a bottom semiconductor layer, the bottom semiconductor layer overlying a buried oxide.

21. A method for integrating an optical device and an electronic device on a semiconductor substrate, comprising:
providing a semiconductor substrate having an active semiconductor layer;
forming openings within the active semiconductor layer in a first region of the semiconductor substrate and openings within the active semiconductor layer in a second region of the semiconductor substrate, wherein the first region corresponds to an optical device portion of the semiconductor substrate and the second region corresponds to an electronic device portion of the semiconductor substrate, wherein forming openings within the active semiconductor layer in the first region and within the active semiconductor layer in the second region comprises one of: (i) simultaneously forming openings in the optical device portion and the electronic device portion, or (ii) independently forming openings in the optical device portion from openings in the electronic device portion, or (iii) using a dual trench process that includes forming the openings in the optical device portion to a first depth, and forming the openings in the electronic device portion to a second depth, the second depth being greater than the first depth;
forming optical liners on sidewalls within the openings of the active semiconductor layer in the optical device portion of the semiconductor substrate;
forming trench liners on sidewalls within the openings of the active semiconductor layer in the electronic device portion of the semiconductor substrate, wherein forming the optical liners in the openings of the active semiconductor layer in the optical device portion of the semiconductor substrate and forming the trench liners in the openings of the active semiconductor layer in the electronic device portion of the semiconductor substrate comprises one of: (i) simultaneously forming the optical liners and the trench liners, or (ii) independently forming the optical liners in the optical device portion from the trench liners in the electronic device portion;
filling the openings of the active semiconductor layer in the optical device portion of the semiconductor substrate and the openings of the active semiconductor layer in the electronic device portion of the semiconductor substrate with a fill material;
forming at least a portion of an electronic device on the active semiconductor layer within the electronic device portion of the semiconductor substrate; and
forming an interlevel dielectric layer overlying the optical device portion and the electronic device portion of the semiconductor substrate, wherein the interlevel dielectric can act as an upper cladding layer of an optical device formed within the optical device portion of the semiconductor substrate.

22. The method of claim 21, wherein forming the optical liners smoothes a roughness of the sidewalls within the openings of the active semiconductor layer in the optical device portion of the semiconductor substrate.

23. The method of claim 21, wherein forming the optical liners comprises an oxidation process optimized to provide a lowest loss waveguide as a function of a reduction in sidewall roughness.

24. The method of claim 21, wherein the optical liners comprises a thickness greater than a thickness of the trench liner.

25. The method of claim 21, wherein forming the openings of the active semiconductor layer in the electronic device portion of the semiconductor substrate comprises etching the openings, and wherein forming the trench liners comprises an oxidation process optimized to passivate the etched sidewalls, round corners of the openings, and to optimize a stress in the active semiconductor layer between the openings of the active semiconductor layer in the electronics device portion of the semiconductor substrate.

26. The method of claim 21, wherein forming the trench liners comprises an oxidation process optimized to control stresses in the active semiconductor layer between the openings.

27. The method of claim 21, wherein the trench liners comprises a thickness configured to provide an optimized high performance electronic device characteristic.

28. The method of claim 21, wherein the optical portion of the semiconductor substrate can comprise one or more of an optical grating coupler, a waveguide, a wavelength selective filter, an optical modulator; or an arrayed waveguide grating.

29. The method of claim 21, wherein forming openings comprises the dual trench process, and wherein forming the optical liner further includes forming the optical liners on the sidewalls, as well as on a bottom surface, of the openings within the active semiconductor layer in the first region.

30. The method of claim 21, wherein the active semiconductor layer comprises one of: (i) a top semiconductor layer of a semiconductor-on-insulator substrate, or (ii) a top semiconductor layer of a dual semiconductor-on-insulator substrate, or (iii) a top semiconductor layer overlying a second semiconductor layer, the second semiconductor layer having an etch selectivity different from an etch selectivity of the top semiconductor layer, and the second semiconductor layer overlying a bottom semiconductor layer, the bottom semiconductor layer overlying a buried oxide.

31. A method for integrating an optical device and an electronic device on a semiconductor substrate, comprising:
providing a semiconductor substrate having an active semiconductor layer, wherein the active semiconductor layer comprises one of: (i) a top semiconductor layer of a semiconductor-on-insulator substrate, or (ii) a top semiconductor layer of a dual semiconductor-on-insulator substrate, or (iii) a top semiconductor layer overlying a second semiconductor layer, the second semiconductor layer having an etch selectivity different from an etch selectivity of the top semiconductor layer, and the second semiconductor layer overlying a bottom semiconductor layer, the bottom semiconductor layer overlying an insulator, or (iv) a top semiconductor layer overlying a second semiconductor layer, the second semiconductor layer overlying a bottom semiconductor layer, the second semiconductor layer being lattice matched to the bottom semiconductor layer, and the bottom semiconductor layer overlying an insulator;
forming openings within the active semiconductor layer in a first region of the semiconductor substrate and openings within the active semiconductor layer in a second region of the semiconductor substrate, wherein the first region corresponds to an optical device portion of the semiconductor substrate and the second region corresponds to an electronic device portion of the semiconductor substrate;
forming optical liners on sidewalls within the openings of the active semiconductor layer in the optical device portion of the semiconductor substrate;
forming trench liners on sidewalls within the openings of the active semiconductor layer in the electronic device portion of the semiconductor substrate, wherein forming the optical liners in the openings of the active semiconductor layer in the optical device portion of the semiconductor substrate and forming the trench liners in the openings of the active semiconductor layer in the electronic device portion of the semiconductor substrate comprises one of: (i) simultaneously forming the optical liners and the trench liners, or (ii) independently forming the optical liners in the optical device portion from the trench liners in the electronic device portion;
filling the openings of the active semiconductor layer in the optical device portion of the semiconductor substrate and the openings of the active semiconductor layer in the electronic device portion of the semiconductor substrate with a fill material;
forming at least a portion of an electronic device on the active semiconductor layer within the electronic device portion of the semiconductor substrate; and
forming an interlevel dielectric layer overlying the optical device portion and the electronic device portion of the semiconductor substrate, wherein the interlevel dielectric can act as an upper cladding layer of an optical device formed within the optical device portion of the semiconductor substrate.

32. The method of claim 31, wherein forming the optical liners smoothes a roughness of the sidewalls within the openings of the active semiconductor layer in the optical device portion of the semiconductor substrate.

33. The method of claim 31, wherein forming the optical liners comprises an oxidation process optimized to provide a lowest loss waveguide as a function of a reduction in sidewall roughness.

34. The method of claim 31, wherein the optical liners have a thickness greater than a thickness of the trench liner.

35. The method of claim 31, wherein forming the openings of the active semiconductor layer in the electronic device portion of the semiconductor substrate comprises etching the openings, and wherein forming the trench liners comprises an oxidation process optimized to passivate the etched sidewalls, round corners of the openings, and to optimize a stress in the active semiconductor layer between the openings of the active semiconductor layer in the electronics device portion of the semiconductor substrate.

36. The method of claim 31, wherein forming the trench liners comprises an oxidation process optimized to control stresses in the active semiconductor layer between the openings.

37. The method of claim 31, wherein the trench liners have a thickness configured to provide an optimized high performance electronic device characteristic.

38. The method of claim 31, wherein the semiconductor substrate comprises the dual semiconductor-on-insulator substrate, and wherein the dual semiconductor-on-insulator substrate comprises a top silicon layer, the top silicon layer overlying a first buried oxide layer, the first buried oxide layer overlying an intermediate silicon layer, the intermediate silicon layer overlying a second bottom oxide layer, and the bottom oxide layer overlying a bottom handle wafer.

39. The method of claim 31, wherein the semiconductor substrate comprises the dual semiconductor-on-insulator substrate, and wherein the dual semiconductor-on-insulator substrate comprises a handle wafer and a donor wafer, the handle wafer having a silicon layer overlying a buried oxide layer overlying a bottom handle layer, and the donor wafer having a silicon layer and an oxide layer, further wherein the donor wafer is inverted and bonded to the silicon layer of the handle wafer via the oxide layer of the donor wafer.

40. The method of claim 31, wherein the active semiconductor layer comprises the top, second, and bottom semiconductor layers, and further wherein the top semiconductor layer comprises silicon, the second semiconductor layer comprises SiGeC, and the bottom semiconductor layer comprises Si.

41. The method of claim 40, further wherein respective concentrations of the Ge and C of the second semiconductor layer are selected so that the resulting SiGeC layer is lattice matched to the bottom semiconductor layer.

42. A method for integrating an optical device and an electronic device on a semiconductor substrate, comprising:
   providing a semiconductor substrate having an active semiconductor layer;
   forming openings within the active semiconductor layer in a first region of the semiconductor substrate and openings within the active semiconductor layer in a second region of the semiconductor substrate, wherein the first region corresponds to an optical device portion of the semiconductor substrate and the second region corresponds to an electronic device portion of the semiconductor substrate, wherein forming openings within the active semiconductor layer in the first region and within the active semiconductor layer in the second region comprises one of: (i) simultaneously forming openings in the optical device portion and the electronic device portion, or (ii) independently forming openings in the optical device portion from openings in the electronic device portion, or (iii) using a dual trench process that includes forming the openings in the optical device portion to a first depth, and forming the openings in the electronic device portion to a second depth, the second depth being greater than the first depth;
   filling the openings of the active semiconductor layer in the optical device portion of the semiconductor substrate and the openings of the active semiconductor layer in the electronic device portion of the semiconductor substrate with a fill material;
   forming at least a portion of an electronic device on the active semiconductor layer within the electronic device portion of the semiconductor substrate;
   forming a salicide blocking layer overlying the optical device portion of the semiconductor substrate;
   saliciding the electronic device portion of the semiconductor substrate, wherein the salicide blocking layer prevents salicidation of the active semiconductor layer within the optical device portion of the semiconductor substrate; and
   forming an interlevel dielectric layer overlying the optical device portion and the electronic device portion of the semiconductor substrate, wherein the interlevel dielectric can act as an upper cladding layer of an optical device formed within the optical device portion of the semiconductor substrate.

43. The method of claim 42, wherein the optical portion of the semiconductor substrate can comprise one or more of an optical grating coupler, a waveguide, a wavelength selective filter, an optical modulator; or an arrayed waveguide grating.

44. The method of claim 42, wherein forming openings comprises the dual trench process, and wherein forming the optical liners further includes forming the optical liner on the sidewalls, as well as on a bottom surface, of the openings within the active semiconductor layer in the first region.

45. The method of claim 42, wherein forming the salicide blocking layer comprises depositing TEOS on the optical device portion and the electronic device portion of the semiconductor substrate and then removing the TEOS from the electronic device portion.

46. The method of claim 42, wherein forming the salicide blocking layer comprises patterning the blocking layer to overlie the optical device portion of the semiconductor substrate alone.

47. The method of claim 42, wherein saliciding includes forming a salicidation metallization overlying the optical device portion and the electronic device portion of the semiconductor substrate, annealing the salicidation metallization to form salicided regions on exposed regions of semiconductor material within the electronic device portion of the semiconductor substrate, wherein the salicide blocking layer prevents salicidation of the salicidation metallization overlying the active semiconductor layer within the optical device portion of the semiconductor substrate.

48. The method of claim 47, further wherein saliciding includes removing unreacted silicidation metallization.

49. The method of claim 42, wherein the active semiconductor layer comprises one of: (i) a top semiconductor layer of a semiconductor-on-insulator substrate, or (ii) a top semiconductor layer of a dual semiconductor-on-insulator substrate, or (iii) a top semiconductor layer overlying a second semiconductor layer, the second semiconductor layer having an etch selectivity different from an etch selectivity of the top semiconductor layer, and the second semiconductor layer overlying a bottom semiconductor layer, the bottom semiconductor layer overlying a buried oxide.

50. A method for integrating an optical device and an electronic device on a semiconductor substrate, comprising:
   providing a semiconductor substrate having an active semiconductor layer, wherein the active semiconductor layer comprises one of: (i) a top semiconductor layer of a semiconductor-on-insulator substrate, or (ii) a top semiconductor layer of a dual semiconductor-on-insulator substrate, or (iii) a top semiconductor layer overlying a second semiconductor layer, the second semiconductor layer having an etch selectivity different from an etch selectivity of the top semiconductor layer, and the second semiconductor layer overlying a bottom semiconductor layer, the bottom semiconductor layer overlying an insulator, or (iv) a top semiconductor layer overlying a second semiconductor layer, the second semiconductor layer overlying a bottom semiconductor layer, the second semiconductor layer being lattice matched to the bottom semiconductor layer, and the bottom semiconductor layer overlying an insulator;
   forming openings within the active semiconductor layer in a first region of the semiconductor substrate and openings within the active semiconductor layer in a second region of the semiconductor substrate, wherein the first region corresponds to an optical device portion of the semiconductor substrate and the second region corresponds to an electronic device portion of the semiconductor substrate;
   filling the openings of the active semiconductor layer in the optical device portion of the semiconductor substrate and the openings of the active semiconductor layer in the electronic device portion of the semiconductor substrate with a fill material;
   forming at least a portion of an electronic device on the active semiconductor layer within the electronic device portion of the semiconductor substrate;

forming a salicide blocking layer overlying the optical device portion of the semiconductor substrate;
saliciding the electronic device portion of the semiconductor substrate, wherein the salicide blocking layer prevents salicidation of the active semiconductor layer within the optical device portion of the semiconductor substrate; and
forming an interlevel dielectric layer overlying the optical device portion and the electronic device portion of the semiconductor substrate, wherein the interlevel dielectric can act as an upper cladding layer of an optical device formed within the optical device portion of the semiconductor substrate.

51. The method of claim 50, wherein forming the salicide blocking layer comprises depositing TEOS on the optical device portion and the electronic device portion of the semiconductor substrate and then removing the TEOS from the electronic device portion.

52. The method of claim 50, wherein forming the salicide blocking layer comprises patterning the blocking layer to overlie the optical device portion of the semiconductor substrate alone.

53. The method of claim 50, wherein saliciding includes forming a salicidation metallization overlying the optical device portion and the electronic device portion of the semiconductor substrate, annealing the salicidation metallization to form salicided regions on exposed regions of semiconductor material within the electronic device portion of the semiconductor substrate, wherein the salicide blocking layer prevents salicidation of the salicidation metallization overlying the active semiconductor layer within the optical device portion of the semiconductor substrate.

54. The method of claim 53, further wherein saliciding includes removing unreacted silicidation metallization.

55. The method of claim 50, wherein the semiconductor substrate comprises the dual semiconductor-on-insulator substrate, and wherein the dual semiconductor-on-insulator substrate comprises a top silicon layer, the top silicon layer overlying a first buried oxide layer, the first buried oxide layer overlying an intermediate silicon layer, the intermediate silicon layer overlying a second bottom oxide layer, and the bottom oxide layer overlying a bottom handle wafer.

56. The method of claim 50, wherein the semiconductor substrate comprises the dual semiconductor-on-insulator substrate, and wherein the dual semiconductor-on-insulator substrate comprises a handle wafer and a donor wafer, the handle wafer having a silicon layer overlying a buried oxide layer overlying a bottom handle layer, and the donor wafer having a silicon layer and an oxide layer, further wherein the donor wafer is inverted and bonded to the silicon layer of the handle wafer via the oxide layer of the donor wafer.

57. The method of claim 50, wherein the active semiconductor layer comprises the top, second, and bottom semiconductor layers, and further wherein the top semiconductor layer comprises silicon, the second semiconductor layer comprises SiGeC, and the bottom semiconductor layer comprises Si.

58. The method of claim 57, further wherein respective concentrations of the Ge and C of the second semiconductor layer are selected so that the resulting SiGeC layer is lattice matched to the bottom semiconductor layer.

59. A method for integrating an optical device and an electronic device on a semiconductor substrate, comprising:
providing a semiconductor substrate having an active semiconductor layer;
forming openings within the active semiconductor layer in a first region of the semiconductor substrate and openings within the active semiconductor layer in a second region of the semiconductor substrate, wherein the first region corresponds to an optical device portion of the semiconductor substrate and the second region corresponds to an electronic device portion of the semiconductor substrate, wherein forming openings within the active semiconductor layer in the first region and within the active semiconductor layer in the second region comprises one of: (i) simultaneously forming openings in the optical device portion and the electronic device portion, or (ii) independently forming openings in the optical device portion from openings in the electronic device portion, or (iii) using a dual trench process that includes forming the openings in the optical device portion to a first depth, and forming the openings in the electronic device portion to a second depth, the second depth being greater than the first depth;
filling the openings of the active semiconductor layer in the optical device portion of the semiconductor substrate and the openings of the active semiconductor layer in the electronic device portion of the semiconductor substrate with a fill material;
forming at least a portion of an electronic device on the active semiconductor layer within the electronic device portion of the semiconductor substrate; and
forming an interlevel dielectric layer overlying the optical device portion and the electronic device portion of the semiconductor substrate, wherein the interlevel dielectric can act as an upper cladding layer of an optical device formed within the optical device portion of the semiconductor substrate.

60. The method of claim 59, wherein the optical portion of the semiconductor substrate can comprise one or more of an optical grating coupler, a waveguide, a wavelength selective filter, an optical modulator; or an arrayed waveguide grating.

61. The method of claim 59, wherein forming openings comprises the dual trench process, and wherein forming the optical liners further includes forming the optical liner on the sidewalls, as well as on a bottom surface, of the openings within the active semiconductor layer in the first region.

62. The method of claim 59, wherein the active semiconductor layer comprises one of: (i) a top semiconductor layer of a semiconductor-on-insulator substrate, or (ii) a top semiconductor layer of a dual semiconductor-on-insulator substrate, or (iii) a top semiconductor layer overlying a second semiconductor layer, the second semiconductor layer having an etch selectivity different from an etch selectivity of the top semiconductor layer, and the second semiconductor layer overlying a bottom semiconductor layer, the bottom semiconductor layer overlying an insulator, or (iv) a top semiconductor layer overlying a second semiconductor layer, the second semiconductor layer overlying a bottom semiconductor layer, the second semiconductor layer being lattice matched to the bottom semiconductor layer, and the bottom semiconductor layer overlying an insulator.

63. The method of claim 62, wherein the semiconductor substrate comprises the dual semiconductor-on-insulator substrate, and wherein the dual semiconductor-on-insulator substrate comprises a top silicon layer, the top silicon layer overlying a first buried oxide layer, the first buried oxide layer overlying an intermediate silicon layer, the intermediate silicon layer overlying a second bottom oxide layer, and the bottom oxide layer overlying a bottom handle wafer.

64. The method of claim 62, wherein the semiconductor substrate comprises the dual semiconductor-on-insulator substrate, and wherein the dual semiconductor-on-insulator substrate comprises a handle wafer and a donor wafer, the handle wafer having a silicon layer overlying a buried oxide layer overlying a bottom handle layer, and the donor wafer having a silicon layer and an oxide layer, further wherein the donor wafer is inverted and bonded to the silicon layer of the handle wafer via the oxide layer of the donor wafer.

65. The method of claim 62, wherein the active semiconductor layer comprises the top, second, and bottom semiconductor layers, and further wherein the top semiconductor layer comprises silicon, the second semiconductor layer comprises SiGeC, and the bottom semiconductor layer comprises Si.

66. The method of claim 62, further wherein respective concentrations of the Ge and C of the second semiconductor layer are selected so that the resulting SiGeC layer is lattice matched to the bottom semiconductor layer.

67. The method of claim 62, wherein the active semiconductor layer comprises the top, second, and bottom semiconductor layers, and further wherein forming the openings in the first region comprises forming the openings in the first region through the top semiconductor layer of the active semiconductor layer alone, and still further wherein forming the openings in the second region comprises forming the openings in the second region through the top semiconductor layer, the second semiconductor layer and the bottom semiconductor layer of the active semiconductor layer.

* * * * *